United States Patent [19]

Hoehn

[11] 4,393,372
[45] Jul. 12, 1983

[54] PARALLEL ANALOG-TO-DIGITAL CONVERTER

[75] Inventor: Wolfgang Hoehn, Kirchzarten, Fed. Rep. of Germany

[73] Assignee: ITT Industries, Inc., New York, N.Y.

[21] Appl. No.: 355,295

[22] Filed: Mar. 8, 1982

[51] Int. Cl.³ .............................................. H03K 13/02
[52] U.S. Cl. ................................ 340/347 AD; 364/575
[58] Field of Search .................... 340/347 AD, 347 M; 358/141, 13, 23; 324/99 D, 112; 364/575

[56] References Cited

U.S. PATENT DOCUMENTS

| | | | |
|---|---|---|---|
| 3,662,380 | 5/1972 | Cargile | 340/347 AD |
| 3,949,170 | 4/1976 | Shionoya | 340/347 AD |
| 4,183,016 | 1/1980 | Sawagata | 340/347 AD |
| 4,270,118 | 5/1981 | Brokaw | 340/347 AD |
| 4,352,123 | 9/1982 | Flamm | 358/23 |

Primary Examiner—C. D. Miller
Attorney, Agent, or Firm—John T. O'Halloran; Peter C. Van Der Sluys

[57] ABSTRACT

In a parallel analog-to-digital converter wherein the comparator inputs are switched between $+\frac{1}{2}$ the voltage corresponding to the least significant bit and $-\frac{1}{2}$ said voltage. There is provided a bipolar differential amplifier-like circuit with a resistor connecting the collectors of the two transistors and a constant current source disposed in the emitter circuit. The comparator inputs are provided with the analog signal through said resistor, while the base of one of said transistors is provided with a clock signal having one-half the frequency of the converter clock signal.

2 Claims, 1 Drawing Figure

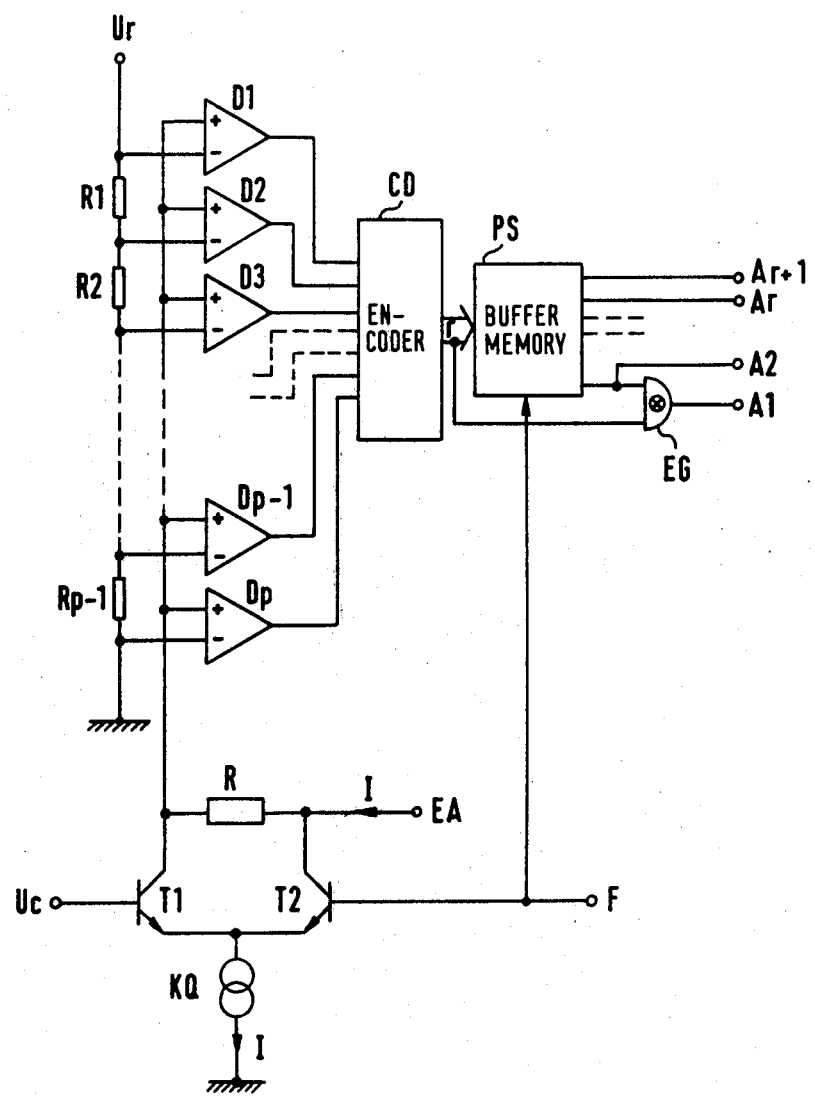

PARALLEL ANALOG-TO-DIGITAL CONVERTER

BACKGROUND OF THE INVENTION

1. Field of the Invention

The present invention relates to parallel analog-to-digital converters and, more particularly, to a converter with $p=2^r-1$ comparators, where r is the number of binary digits of the converter output signal diminished by 1, wherein the analog signal is applied to the comparator inputs of one kind, wherein the inputs of the other kind are connected consecutively to the taps of a resistive voltage divider consisting of equal-value resistors and having a reference voltage Ur applied thereto, and wherein the analog signal is shifted by $\Delta U = U_r/2^{r+1}$ for the duration of every second clock period of the converter sampling signal.

2. Description of the Prior Art

A parallel analog-to-digital converter of this kind is disclosed in prior European application No. 81102603.8, which claims the priority of German Patent Application P 30 15 141.8, and corresponds to U.S. patent application Ser. No. 237,187, now U.S. Pat. No. 4,352,123 filed Feb. 23, 1981 as one of two possibilities of reducing the number of comparators and resistors of the voltage divider connected to the reference voltage. The prior application describes in detail how the voltage change $\Delta U$ is achieved by suitably wiring the voltage divider, while the implementation of the switchover of the comparator inputs fed with the analog signal is not covered.

SUMMARY OF THE INVENTION

An object of the present invention is to provide a circuit for switching the DC voltage level at the comparator inputs fed with the analog signal.

One advantage of the invention is that for the generally necessary voltage changes $\Delta U$ in the millivolt range (e.g., in a converter according to the invention with a six-digit output signal), the resistor R can have a low value (e.g., $\Delta U = 10$ mV, $R = 10\Omega$, $I = 1$ mA), and, thus, is easy to implement using monolithic integrated circuit techniques. Another advantage of the invention lies in the fact that as a result of this low resistance, there is no limit to the frequency response of the converter.

BRIEF DESCRIPTION OF THE DRAWING

The drawing is a schematic circuit diagram of one embodiment of the invention.

DESCRIPTION OF THE INVENTION

The parallel analog-to-digital converter contains the comparators D1, D2, D3, Dp-1, Dp, which are preferably differential amplifiers. The inverting inputs of the comparators are connected to the taps of the voltage divider consisting of equal-value resistors R1, R2, Rp-1. One end of the voltage divider has the reference voltage Ur applied to it, while the other end is grounded.

The noninverting inputs of the comparators are connected in common to the analog-signal input EA via the resistor R. The resistor R interconnects the collectors of the two transistors T1, T2, whose emitters are coupled together, and the junction point is connected to ground via a constant-current source KQ supplying the current I. In the FIGURE, the collector of the transistor T1 is thus connected to the interconnected noninverting inputs of the comparators D1 to Dp, while the collector of the transistor T2 is connected to the analog-signal input EA.

The base of one of the two transistors T1, T2 is at the fixed potential Uc-in the FIGURE, this is the transistor T1-, while the base of the other transistor-the transistor T2-is fed with the clock signal F of half the frequency of the converter clock signal.

The outputs of the comparators D1 to Dp are coupled to the inputs of the encoder CD, whose output provides an r-digit binary signal in the usual manner. This binary signal is stored in the buffer memory PS, which is clocked by the clock signal F. The least significant bit of the encoder output signal and the least significant bit of the buffer-memory output signal are applied to the two inputs of the exclusive-OR gate EG, whose output provides the least significant bit A1 of the converter output signal. The output for the least significant bit of the buffer memory PS then provides the second-lowest bit A2 of the converter output signal. Correspondingly, the most significant bit of the buffer-memory output signal is the most significant bit Ar+1 of the converter output signal.

With the invention, just as with the prior art arrangement, it is thus possible to generate a (r+1)-digit converter output signal with $2^r-1$ comparators which only provide an r-digit signal.

To accomplish this, the digital signal appearing at the output of the encoder CD during a given period of the converter clock signal is stored in the buffer memory PS until the next period of the converter clock signal, and toward the end of this period, the XOR of the least significant bit of this signal and the least significant bit of the new digital signal appearing at the output of the encoder CD is formed by the exclusive-OR gate EG. Since, in the second clock-signal period being considered here, the voltage at the noninverting comparator inputs is changed by $\Delta U = U_r/2^{r+1}$, the exclusive-OR operation at the end of every second period of the converter clock signal results in the gain of one additional converter output signal bit.

In choosing the value of the resistor R, it must be taken into account that the current I from the constant-current source KQ, whose circuit is completed via the subcircuit supplying the analog signal to the analog-signal input EA, flows through the transistor T2 and, thus, not through the resistor R during one part of the, e.g., square-wave clock signal F, and through the transistor T1 and, thus, the resistor R during the other part. The value of the resistor R must thus be chosen to be $R = \Delta U/I = 2^{-(r+1)} U_r/I$. It is obvious that the amplitude of the clock signal F must be so chosen in relation to the fixed voltage Uc that the two transistors T1, T2 can be alternately turned on and off during the aforementioned two parts of the clock signal F.

The invention is especially suitable for fast parallel analog-to-digital converters, e.g., for video signals, and permits an, e.g., six-bit converter output signal to be produced with half the number of comparators required without an input-voltage change of $\Delta U$.

What is claimed is:

1. In a parallel analog-to-digital converter with $p=2^r-1$ comparators, where r is the number of bits of the (r+1)-bit converter output signal diminished by 1, and the analog signal is applied to either the noninverting or inverting input of each comparator and the other of said comparator inputs being connected consecutively to the taps of a resistive voltage divider consisting of equal-value resistors and having a reference voltage (Ur) applied thereto, wherein the analog signal is shifted by $\Delta U = Ur/2^{r+1}$ for the duration of every second clock period of the converter clock signal, and wherein the comparator outputs are connected to a digital encoder followed by a buffer memory, wherein the improvement comprises:

a pair of transistors having their emitters connected;

a resistor connected between the collectors of the two transistors, with the analog signal being applied to the appropriate comparator inputs through said resistor;

a constant current source disposed in the emitter path of the pair of transistors, the base of one of the transistors being supplied with a fixed potential, and the base of the other transistor being fed with a clock signal having one-half the frequency of the converter clock signal, the value of the resistor being chosen in accordance with the equation $R = \Delta U/I = 2^{-(r+1)} Ur/I$, where I is the strength of the constant current source; and an exclusive-OR gate having inputs being provided with the least significant bit at the output of the digital encoder and the corresponding bit at the output of the buffer memory, whereby the gate output provides a signal that functions as the least significant bit of the output signal of the parallel analog-to-digital converter.

2. A converter as described in claim 1, wherein the pair of transistors are bipolar transistors.

* * * * *